April 4, 1950 G. L. PEARSON ET AL 2,502,479

SEMICONDUCTOR AMPLIFIER

Filed Sept. 24, 1948

INVENTORS G.L.PEARSON
W.SHOCKLEY
BY

ATTORNEY

Patented Apr. 4, 1950

2,502,479

UNITED STATES PATENT OFFICE 2,502,479

SEMICONDUCTOR AMPLIFIER

Gerald L. Pearson, Millington, and William Shockley, Madison, N. J., assignors to Bell Telephone Laboratories, Incorporated, New York, N. Y., a corporation of New York Application September 24, 1948, Serial No. 50,897

26 Claims. (Cl. 179—171)

Figure 1:
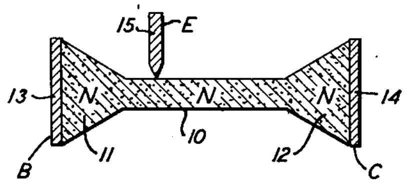

This invention relates to means for and methods of translating or controlling electrical signals and more particularly to circuit elements utilizing semiconductors and to systems including such elements.

One general object of this invention is to provide new and improved means for and methods of translating and controlling, for example amplifying, generating, modulating, etc., electric signals.

Another general object of this invention is to enable the efficient, expeditious and economic translation or control of electrical energy.

A further object of this invention is to decrease noise, particularly contact noise, in semiconductor signal translating devices.

Still another object of this invention is to enable reduction of transit time effects in such devices.

A still further object of this invention is to increase the feedback in semiconductor type amplifiers and oscillators.

In accordance with one broad feature of this invention, translation and control of electric signals are effected by alteration or regulation of the conduction characteristics of a semiconductive body. More specifically, in accordance with one broad feature of this invention, such translation and control are effected by control of the characteristics, for example the impedance, of an attenuated part intermediate two portions of a semiconductive body in such a manner as to alter advantageously the flow of current between these two portions.

One feature of this invention relates to the control of current flow through a semiconductive body by means of carriers of charge of opposite sign to the carriers which normally convey the current through the body.

An additional feature of this invention relates to a body of semiconductive material, means for making electrical connection respectively to two portions of said body, means for making a third electrical connection to an attenuated portion of the body intermediate said portions, and circuit means including power sources whereby the influence of the third connection may be made to control the flow of current between the other connections.

Another feature of this invention involves a semi-conductive body which may be used for voltage and power amplification when associated with means for introducing mobile carriers of current to the body at relatively low voltage and extracting carriers of current at a relatively high voltage.

A further feature of this invention resides in a body of semiconductive material having an attenuated intermediate section, means for making a base connection at one end of the attenuated section, means for making a low impedance input connection to the attenuated section near the base connection, and means for making a high impedance output connection adjacent the other end of the attenuated section.

Another feature of this invention resides in decreasing contact noise by substituting for a point contact rectifying junction a barrier within an integral part of the semiconductor.

A further feature of this invention lies in the attenuated portion of the semiconductor which allows the use of very high fields without undue heating, thereby increasing the drift velocities of current carriers and thus reducing transit time effects.

Another feature of this invention involves improvement of feedback by the use of an internal barrier collector connection which stabilizes current gain thereby allowing increase in feedback without loss of stability.

Figure 7:
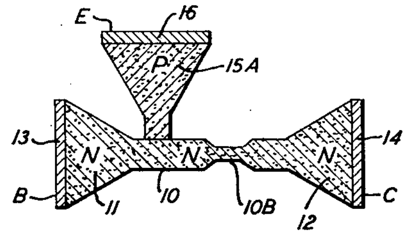
Figure 8:
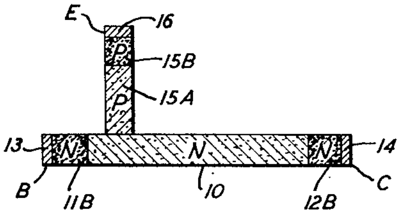
Figure 9:
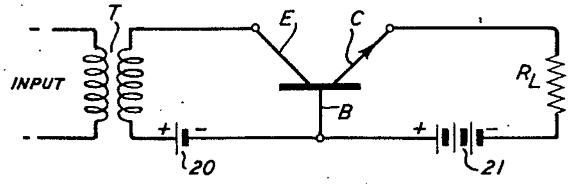

Other objects and features of this invention will appear more fully and clearly from the following description of illustrative embodiments thereof taken in connection with the appended drawings in which:

Figs. 1 to 8, inclusive, show in section several illustrative embodiments of the invention; and Fig. 9 illustrates one circuit in which these embodiments may be employed.

As an aid to a full understanding of the description hereinafter of specific embodiments of the invention, a brief discussion of some pertinent principles and phenomena, and an explanation of certain terms employed in the description is in order.

As is known, see for example "Crystal Rectifiers" by H. C. Torrey and C. A. Whitmer, volume 15 of the M. I. T. Radiation Laboratories Series, there are two kinds of semicondution, referred to as intrinsic and extrinsic. Although some of the semiconductive materials contemplated within the purview of this invention may exhibit both kinds of semiconduction, the kind referred to as extrinsic is of principal import.

Semiconduction may be classified also as of two types, one known as conduction by electrons or the excess process of conduction and the other known as conduction by holes or the defect process of conduction. The term "holes," which refers to carriers of positive electric charges as distinguished from carriers, such as electrons, of negative charges is explained more fully in the application of William Shockley, Serial No. 35,423 filed June 26, 1948.

Semiconductive materials which have been found suitable for utilization in devices of this invention include germanium and silicon containing minute quantities of significant impurities which comprise one way of determining the conductivity type (either N or P type) of the semiconductive material. The conductivity type may also be determined by energy relations within the semiconductor. For a more detailed explanation, reference is made to the application of J. Bardeen and W. H. Brattain Serial No. 33,466 filed June 17, 1948.

Methods of preparing germanium material suitable for use in the devices of this invention are disclosed in the application of J. H. Scaff and H. C. Theuerer Serial No. 638,351 filed December 29, 1945. Silicon material may be prepared by methods disclosed in United States Patents 2,402,661 and 2,402,662 to R. S. Ohl and in the application of J. H. Scaff and H. C. Theuerer Serial No. 793,744 filed December 24, 1947.

The terms N and P type are applied to semiconductive materials which tend to pass current easily when the material is respectively negative or positive with respect to a conductive connection thereto and with difficulty when the reverse is true, and which also have consistent Hall and thermoelectric effects.

The expression "significant impurities" is here used to denote those impurities which affect the electrical characteristics of the material such as its resistively, photosensitivity, rectification, and the like, as distinguished from other impurities which have no apparent affect on these characteristics. The term "impurities" is intended to include intentionally added constituents as well as any which may be included in the basic material as found in nature or as commercially available. Germanium and silicon are such basic materials which along with some representative impurities will be noted in describing illustrative examples of the present invention. Lattice defects, such as vacant lattice sites and interstitial atoms, when effective in producing holes or electrons, are to be included in "significant impurities."

The term "barrier" or "electrical barrier" used in the description and discussion of devices in accordance with this invention is applied to a high resistance interfacial condition between contacting semiconductors or respectively opposite conductivity type, or between a semiconductor and a metallic conductor whereby current passes with relative ease in one direction and with relative difficulty in the other.

Reference is made to the previously noted application of William Shockley for further background material pertinent to this invention.

The devices to be described are relatively small which has necessitated some exaggeration of proportions in the interest of clarity in the illusrtations which are mainly or essentially digrammatic.

Referring to Fig. 1, the circuit element therein illustrated comprises a body of semiconductive material such as high back voltage germanium used for rectifiers. The body comprises a thin filament 10 having enlarged end portions 11 and 12, respectively. Ohmic connections 13 and 14 are made respectively to the large portions 11 and 12. These connections may comprise a solder film, an electroplated film or the like. A connection is made to an intermediate portion of the filament 10 by means of a metallic point contact 15 which may be of tungsten, phosphor bronze or like suitable material. The body of semiconductive material in this device is of the same conductivity type throughout, for example N type as illustrated.

Figure 2:
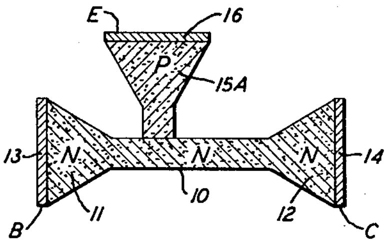

The device shown in Fig. 2 is similar to that shown in Fig. 1 but with a stub 15A substituted for the point contact 15 of Fig. 1. The stub 15A is of opposite conductivity type, i. e. P type, to that of the filament 10, which in this case is of N type. There is thus a barrier between 15A and 10. The part 15A may be provided with a contact or connection 16 similar to 13 and 14.

Figure 3:
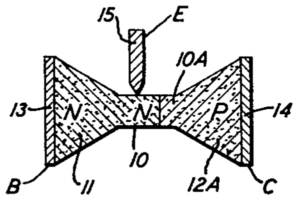

In the device illustrated in Fig. 3, the portion 12 of Fig. 1 and a part of the filament 10 have been replaced by a filament section 10A and an enlarged section 12A both of material of opposite conductivity type to the rest of the filament or of P type as in the illusration.

Figure 4:
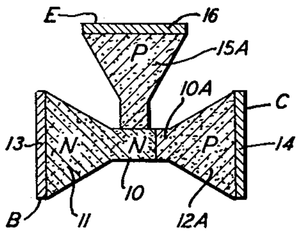

The device shown in Fig. 4 differs from that in Fig. 1 in the ways shown in both Figs. 2 and 3. A P-type stub 15A is substituted for the point contact 15 and the portions 10A and 12A are also of P-type material.

Figure 5:
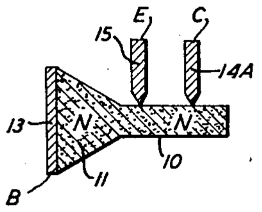

In Fig. 5 there is shown a device in which the enlarged portion 12 and connection 14 are replaced by a point contact 14A similar to the contact 15 and also applied to the side of the filament 10.

Figure 6:
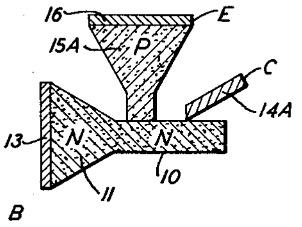

In the device illustrated in Fig. 6 the stub 15A is similar to that shown in Figs. 2 and 4 and the connection 14A is like that of Fig. 5.

The device illustrated in Fig. 7 is like that of Fig. 2 except for the additionaly attenuated portion 10B of the filament 10. Such a filament construction may also be used in other embodiments of the device such as those illustrated.

In the devices shown and described in Figs. 1 to 7, inclusive, the enlarged sections 11, 12, 12A and 15A may be considered as enlarged in both the direction parallel and perpendicular to the plane of the paper with contacts such as 13, 14, etc. applied to their end faces. Devices of this type may also be made with the enlarged portions of the same thickness as the filaments in the direction perpendicular to the paper. In this case, the ohmic connections such as 13 and 14 are made to a face of the portion parallel to the plane of the paper. These devices could also be made relatively thick in the direction perpendicular to the plane of the paper with contacts such as 15 and 14A as knife edges and the other connections of comparable thickness. In this case the filament 10 would be replaced by a thin sheet of semiconductive material.

In order to coordinate the illustrations of Figs. 1 to 8 inclusive, with the wiring diagram of Fig. 9, connections such as 13, 14 and 15 of Fig. 1 and similar connections in the other figures have been labeled "B," "C" and "E" to denote respectively the base, collector and emitter connections. The corresponding elements of Fig. 9 have been similarly labeled.

In the circuit of Fig. 9 the input, which may be by way of transformer T as shown, across a suitable resistor, or by other well-known means, is connected between the base B and the emitter E with a biasing source, such as battery 20 in circuit. The output represented by the load $R_L$ is connected between the collector C and the base B and includes a biasing source 21. For an N-type material as illustrated in Figs. 1 to 8 for the main part of the device, the source 20 will have its positive pole connected to the emitter E and its negative pole to the base B. In such cases, the battery 21 will have its positive pole connected to the base B and its negative pole to the collector C.

As has been more fully explained in the previously noted patent applications Serial Nos. 33,466 and 35,423, if the bias of battery 20 is of the order of a fraction to one volt and that of battery 21 is of the order of 10 to 100 volts, a relatively small signal applied to the input will appear as an exemplified signal across the resistor $R_L$. If the devices are all changed by substituting P-type material for N-type material and the polarities of the biasing batteries are reversed, similar results may be obtained. Other semiconductive materials such as silicon may also be employed.

One method of making devices of the kind herein disclosed is described in the application of Gerald L. Pearson, Serial No. 50,896, filed September 24, 1948.

Devices of this type having a high back voltage germanium filament of the order of .005 inch in width and thickness and .025 inch in length have been successfully operated as amplifiers with appreciable gain.

In devices of the type described, the attenuated portion of the semiconductive body, such as the filament 10 of Figs. 1 to 8 inclusive, makes it possible to have relatively high fields acting along the filament without undue heating, since the small volume concerned does not lead to the production of a large amount of heat. These high fields have the advantage of producing high drift velocities for the mobile current carriers, thereby reducing transit time effects where this is desired.

In some embodiments, e. g. those shown in Figs. 1, 2, 7 and 8, a high impedance output is obtained by virtue of having a relatively high resistance filament of semiconductor between the emitter and the collector connections. In the other illustrated embodiments, most of the high impedance of the output circuit is due to the barrier of an N-P junction or a metallic rectifier point at the collector.

In all of the embodiments shown in which filament at the emitter E and beyond in the direction of the collector C is of N-type material, "holes" or positive carriers are introduced or injected into this N-type material. The emitter is shown as either a metallic point contact or a stub of P-type material making an intimate contact to the N-type filament. The conductivity of this P-type stub should be higher than the conductivity of the filament so that a predominant portion of the emitter current will consist of holes as discussed in the Shockley application previously noted. The holes which are emitted at E flow along the relatively high impedance path to the collector C. Although this path is of high impedance for changes in the voltage on the collector, the polarity of the source is such that these holes flow readily along it. The holes emitted at E are drawn along this path and add to its conductivity in two ways, (1) due to their own presence as current carriers, and (2) because their space charge calls for a compensating space charge of electrons which also leads to an enhancement of conductivity.

In some applications it may be desirable to have low feedback resistance between the base and the emitter. This may be accomplished by placing element 15 in close proximity to the point at which 10 and 11 join. In other applications where feedback may be desired, its value can be adjusted within the device by increasing the length of the attenuated region 10 between 15 and 11.

Figs. 1, 2 and 4 show structures composed entirely of semiconductors except for the ohmic low resistance contacts. For this reason they may be expected to have reduced contact noise compared to structures which like those of Figs. 3, 5 and 6 employ metal point contacts.

The structures shown in Figs. 1, 2, 3, 4, 7 and 8 do not use point contacts as collectors. For this reason they may be expected to show relatively stable values for $\alpha$. The current multiplication factor $\alpha$ is $(\delta I_C/\delta I_E)$ at constant $V_C$ as defined in the application of J. Bardeen and W. H. Brattain previously noted where $I_C$=collector current
$I_E$=emitter current
$V_C$=collector voltage This will increase the amount of feedback which may usefully be employed with these devices so as to increase the input impedance and thus facilitate impedance matching in cascaded structures.

The enlarged ends provided to produce ohmic contacts in these structures may be replaced by regions of tapered impurity content so as to have very high conductivity semiconductive material at the metal contact electrode. As discussed in the application of W. Shockley previously noted this will provide a low resistance contact with a metal and thus achieve the same result as is obtained by the enlarged portions shown in Figs. 1 to 7. Fig. 8 shows a modification of Fig. 2 in accordance with this principle. Parts 11B, 12B and 15B being of high conductivity material whereas 10 and 15A are of low conductivity material.

If the filament as described in the foregoing were of P-type material, electrons would be injected at the emitter, the biasing voltages as shown in Fig. 7 would be reversed and the roles of electrons and holes would also be reversed.

Thus, filamentary devices of this type allow the use of relatively high fields thereby increasing the drift velocities of mobile current carriers and so reducing transit time effects, which allows a longer emitter-collector path to be used to attain high output impedance without a barrier at the collector. Additional high impedance, where required, may be added by introducing such a barrier either by means of an N-P junction or point contact. Furthermore, in cases where the barrier adjacent the collector furnishes a sufficiently high impedance or is desired for other reasons, the emitter-collector distance may be reduced thereby reducing transit time effects in this manner.

Representative significant impurities in germanium are arsenic and aluminum and in silicon are phosphorus and boron. The arsenic and phosphorus produce N-type material and aluminum and boron P-type material respectively.

Although this invention has been shown and described by means of illustrative embodiments thereof, it is not intended that the spirit and scope of the invention be limited thereby.

What is claimed is:

1. A translating device comprising a filament of semiconductive material, means for making a base connection at one end of the filament, means for making a low impedance connection to the filament near the base connection, and means for making a high impedance connection adjacent the other end of the filament.

2. A translating device comprising a filament of semiconductive material, means for making an ohmic connection at one end of the filament, means for making a rectifying connection to the filament near the ohmic connection, and means for making another connection to the filament remote from the ohmic connection.

3. A circuit element comprising a thin filament of semiconductive material having an enlarged portion at at least one end, means for making connection to each end of the filament, and means for making rectifying connection to an intermediate portion of the filament.

4. A circuit element as defined in claim 3 in which both ends of the filament are enlarged and the end connections are ohmic.

5. A circuit element as defined in claim 3 in which one of the end connections is ohmic and the other is rectifying.

6. A circuit element as defined in claim 3 in which one of the end connections is ohmic and the other is a metallic point contact.

7. A circuit element as defined in claim 3 in which portions of the filament with their adjacent enlarged end portions are of opposite conductivity type separated by a barrier in the filament.

8. A circuit element as defined in claim 3 in which the means for making rectifying connection is a metallic point contact.

9. A circuit element as defined in claim 3 in which the means for making rectifying connection comprises a projection on the filament of semiconductive material of opposite conductivity type to the filament material at the point of juncture therewith.

10. A circuit element as defined in claim 3 in which the filament and its adjacent enlarged portions comprise zones of opposite conductivity type separated by a barrier and the means for making rectifying connection comprises a projection on the filament of semiconductive material of opposite conductivity type to the filament material at the point of juncture therewith.

11. A circuit element as defined in claim 3 in which the means for making rectifying connection comprises a projection on the filament of semiconductive material of opposite conductivity type to the filament material at the point of juncture therewith and one end connection is a metallic point contact.

12. A translating device comprising a body of semiconductive material having an attenuated portion, means for making an ohmic connection to the body adjacent one end of the attenuated portion, means for making a rectifying connection to the attenuated portion, and means for making a connection to the body at the other end of the attenuated portion at a region of high impedance with respect to that part of the body adjacent the rectifying connection.

13. A circuit element comprising a body of semiconductive material having an attenuated portion, means for making connection to each end of the attenuated portion, and means for making rectifying connection to an intermediate part of the attenuated portion.

14. An amplifier comprising a filament of semiconductive material, an ohmic base connection adjacent one end of the filament, means for introducing current to said filament including a rectifying connection near the base connection and a source of relatively low voltage between the base connection and the rectifying connection, said voltage poled in the direction of easy current flow into said filament at the rectifying connection, and means for extracting current from the filament including a contact to the filament remote from the base connection and a source of relatively high voltage between the base connection and the remote connection.

15. An amplifier comprising a body of semiconductive material having an attenuated portion, means for making a base connection to said body adjacent one end of the attenuated portion, means for introducing current to said attenuated portion including a rectifying connection thereto near the base connection and a source of relatively low voltage between the base connection and the rectifying connection, said voltage adjusted to produce current flow in the direction of easy current flow to said attenuated portion at the rectifying connection, and means for extracting current from the body including a connection remote from the rectifying connection and on the opposite end of the body to the base connection, and a source of relatively high voltage between the base connection and the remote connection.

16. An amplifier comprising a body of semiconductive material having an attenuated portion, means for making a base connection to said body adjacent one end of the attenuated portion, means for introducing to said attenuated portion current carriers of a sign opposite to that of carriers normally present in said portion, said means including a rectifying connection to said portion near the base connection and a source of relatively low voltage connected between the base connection and the rectifying connection, said voltage adjusted to produce current flow in the direction of easy current flow into said portion at the rectifying connection, and means for extracting current from the body including a connection remote from the rectifying connection and on the opposite end of the body to the base connection and a source of relatively high voltage between the base connection and the remote connection.

17. A circuit element comprising a thin filament of high back voltage N-type germanium material, means for making connection to each end of the filament, and means for making rectifying connection to an intermediate portion of the filament.

18. A circuit element comprising a thin filament of semiconductive material, means for making connection to each end of the filament, and means for introducing to said filament current carriers of opposite sign to those normally present therein, said means including a rectifying connection to an intermediate portion of the filament.

19. A circuit element comprising a thin filament of N-type semiconductive material, means for making connection to each end of the filament, and means for introducing positive carriers of current to said filament, said means including a rectifying connection to an intermediate portion of the filament.

20. A translating device comprising a filament of semiconductive material, means for introducing current carriers of a sign opposite to that of those normally present in said material to an intermediate portion of said filament, means for making connections to said filament longitudinally of said current introducing means and on opposite sides of said current introducing means respectively, the path between one of these connecting means and the current introducing means being of relatively low impedance and the path between the other of these connecting means and the current introducing means being of relatively high impedance.

21. A translating device comprising a body of semiconductive material having an attenuated portion, connections to two regions of said body spaced to include at least a part of the attenuated portion between them, and means for introducing to said part current carriers opposite in sign to those normally present therein, including a connection to said part intermediate of the other connections, the paths between the intermediate connection and the other connections being respectively of relatively low and relatively high impedance.

22. A translating device comprising a semiconductive body having a thin portion intermediate its ends, an ohmic connection to said body adjacent one end thereof, a rectifying connection to said thin portion at a region thereof toward said one end, and an output connection to said portion at a region thereof remote from said end.

23. A translating device comprising a filament of germanium material, means for making a base connection at one end of the filament, means for making a low impedance connection to the filament near the base connection, and means for making a high impedance connection adjacent the other end of the filament.

24. A translating device as defined in claim 23 in which the germanium material is of N type.

25. A translating device comprising a body of germanium material having an attenuated portion, means for making an ohmic connection to the body at one end of the attenuated portion, means for making a rectifying connection to the attenuated portion, and means for making a connection to the other end of the attenuated portion at a region of high impedance relative to the part of the body adjacent the rectifying connection.

26. A translating device comprising a body of semiconductive material having an attenuated portion, means for making a connection to the body adjacent one end of the attenuated portion, means for making connection in a manner allowing easy introduction of current carriers of opposite sign to those normally present in the attenuated portion to an intermediate part of said attenuated portion, and means for making a connection to the body adjacent the other end of the attenuated portion at a region of high impedance with respect to said intermediate part of the attenuated portion.

GERALD L. PEARSON.
WILLIAM SHOCKLEY.

No references cited.